US010701798B2

(12) United States Patent
Mayes et al.

(10) Patent No.: US 10,701,798 B2
(45) Date of Patent: Jun. 30, 2020

(54) SYSTEMS AND APPARATUSES FOR POWER ELECTRONICS WITH HIGH CURRENT CARRYING CONDUCTORS

(71) Applicant: GE Aviation Systems Limited, Cheltenham (GB)

(72) Inventors: Julian Peter Mayes, Cheltenham (GB); John Oliver Collins, Cheltenham (GB); Peter James Handy, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 0 days.

(21) Appl. No.: 16/094,280

(22) PCT Filed: Apr. 25, 2017

(86) PCT No.: PCT/EP2017/059829
§ 371 (c)(1),
(2) Date: Oct. 17, 2018

(87) PCT Pub. No.: WO2017/186738
PCT Pub. Date: Nov. 2, 2017

(65) Prior Publication Data
US 2019/0132944 A1 May 2, 2019

(30) Foreign Application Priority Data
Apr. 28, 2016 (GB) .................................. 1607419.7

(51) Int. Cl.
*H05K 1/02* (2006.01)
*H03K 17/12* (2006.01)
(Continued)

(52) U.S. Cl.
CPC ......... *H05K 1/0265* (2013.01); *H03K 17/122* (2013.01); *H03K 17/687* (2013.01);
(Continued)

(58) Field of Classification Search
CPC .......................... H05K 1/0263; H05K 1/0265
See application file for complete search history.

(56) References Cited

U.S. PATENT DOCUMENTS 4,178,225 A 12/1979 Evans et al.
5,457,057 A 10/1995 Evans et al.
(Continued)

FOREIGN PATENT DOCUMENTS

DE 102014224172 A1 6/2016
WO 2008088755 A2 7/2008

OTHER PUBLICATIONS

Great Britain Search Report and Written Opinion dated Oct. 25, 2016 which was issued in connection with Great Britain patent No. GB1607419.7 which was filed on Apr. 28, 2016.
(Continued)

*Primary Examiner* — Hai L Nguyen
(74) *Attorney, Agent, or Firm* — McGarry Bair PC (57) ABSTRACT

Systems and apparatuses for electrically switching current include a first conductor formed of an electrically conductive material and having a first longitudinal axis; a second conductor formed of the electrically conductive material and having a second longitudinal axis; a set of switching components, each component selectively configured to electrically couple the first conductor to the second conductor; and a printed circuit board on which the first and second conductors are disposed. The width of the first conductor along the first longitudinal axis varies such that the current density in the first conductor is substantially constant along the first longitudinal axis and the width of the second conductor along the second longitudinal axis varies such that the current density in the second conductor is substantially constant along the second longitudinal axis.

20 Claims, 6 Drawing Sheets (51) Int. Cl.
 *H03K 17/687* (2006.01)
 *H05K 1/18* (2006.01)
(52) U.S. Cl.
 CPC ........... *H05K 1/0257* (2013.01); *H05K 1/181* (2013.01); *H05K 2201/0746* (2013.01); *H05K 2201/09227* (2013.01); *H05K 2201/09727* (2013.01); *H05K 2201/09827* (2013.01); *H05K 2201/10166* (2013.01); *H05K 2201/10272* (2013.01); *H05K 2201/10522* (2013.01)

(56) References Cited

U.S. PATENT DOCUMENTS

| | | | |
|---|---|---|---|
| 5,623,169 A * | 4/1997 | Sugimoto | B60R 16/0207 307/10.1 |
| 6,700,795 B1 | 3/2004 | Jones et al. | |
| 7,755,183 B2 * | 7/2010 | Yamamoto | H01L 23/49822 257/693 |
| 8,847,656 B1 | 9/2014 | Ezekiel et al. | |
| 2008/0174926 A1 | 7/2008 | Evans et al. | |
| 2009/0200985 A1 | 8/2009 | Zane et al. | |

OTHER PUBLICATIONS

International Search Report and Written Opinion dated Aug. 4, 2017 which was issued in connection with PCT No. PCT/EP2017/059829 which was filed on Apr. 25, 2017.

* cited by examiner

FIG. 6

SYSTEMS AND APPARATUSES FOR POWER ELECTRONICS WITH HIGH CURRENT CARRYING CONDUCTORS

BACKGROUND

Electrical power distribution systems manage the allocation of power from energy sources to electrical loads that consume distributed electrical power. In aircraft, gas turbine engines that propel the aircraft typically also provide mechanical energy that ultimately powers a number of different accessories such as generators, starter/generators, permanent magnet alternators (PMA), fuel pumps, and hydraulic pumps, i.e., equipment for aircraft functions other than propulsion. As well, contemporary aircraft need electrical power for electrical loads related to avionics, communications, motors, and other electric equipment.

Over time, aircraft electrical power source voltages have increased. Aircraft with 14- and 28-volt direct current (VDC) electrical power systems have given way to aircraft with electrical power systems operating at 115 volts alternative current (VAC) and 230 VAC. Presently, aircraft can include one or more electrical power sources that operate at voltages including plus/minus 270 VDC and deliver high current that often ranges, for example, from 40 to 100 Amperes. A current wide-body twin-engine commercial jet liner uses a hybrid voltage electrical system that includes sub-systems operating at voltages of 230 VAC, 115 VAC, 28 VDC along with a bipolar, high voltage, direct current subsystem that includes plus and minus 270 VDC sources.

Electrical power distribution systems typically include one or more solid-state power controllers (SSPC). In order to meet the requirements of ever higher current ratings in SSPCs, arrays of solid-state devices are interconnected to lower the total impedance of the SSPC. As these arrays include more elements to meet overall impedance requirements of the SSPC, the design of the controller becomes complicated. That is, an SSPC that includes a large number of solid-state switching elements can have a complex interconnect and mounting scheme.

BRIEF DESCRIPTION

In one aspect, an apparatus for electrically switching current includes a first conductor formed of an electrically conductive material and having a first longitudinal axis; a second conductor formed of the electrically conductive material and having a second longitudinal axis; a set of switching components, each component selectively configured to electrically couple the first conductor to the second conductor; and a printed circuit board on which the first and second conductors are disposed. The width of the first conductor along the first longitudinal axis varies such that the current density in the first conductor is substantially constant along the first longitudinal axis and the width of the second conductor along the second longitudinal axis varies such that the current density in the second conductor is substantially constant along the second longitudinal axis.

In another aspect, a system for electrical power distribution includes a direct current source component; an electrical loading component capable of drawing electrical power from the direct source component; a set of switching components configured to selectively couple power from the direct current source component to the electrical loading component by switching between an open state that decouples power from the direct current source component to the electrical loading component and a closed state that couples power from the direct current source component to the electrical loading component; a control component configured to alter the state of the set of the switching components; a first conducting component configured flow electrical current between the direct source component and the set of switching components; and a second conducting component configured to flow electrical current between the set of switching components and the electrical loading component. The width of the first conducting component varies such that the current density in the first conducting component is substantially constant and the width of the second conducting component varies such that the current density in the second conducting component is substantially constant.

DETAILED DESCRIPTION

The embodiments of the present invention are described herein in the context of an electrical power distribution system of an aircraft, which enables production of electrical power from an energy source such as a turbine engine, jet fuel, hydrogen, etc. However, it will be understood that while one embodiment of the invention is described with respect to an aircraft environment, the invention is not so limited and has general application to electrical power distribution systems in non-aircraft applications, such as other mobile applications and non-mobile industrial, commercial, and residential applications. For example, applicable mobile environments can include an aircraft, spacecraft, space-launch vehicle, satellite, locomotive, automobile, etc. Commercial environments can include manufacturing facilities or power generation and distribution facilities or infrastructure.

At least some of the embodiments of the invention provide for electrical power distribution systems and apparatuses that include high current switching capabilities. The electrical power distribution system includes a set of switching elements such as transistors. It will be understood that "a set" can include any number of solid-state switching elements, including a single solid-state switch. Similarly, "a set" as used herein can include any number of elements, including a single element.

In avionics, electrical losses in the electrical power distribution system can be critical. Inefficiencies in the electrical power distribution system can result in excessive heat being generated in an aircraft where it is difficult to dissipate. Excessive heat in power electronics can result in deleterious effects including electromigration which can compromise reliability of the avionics. Consequently, design optimizations for elements of the electrical power distribution system can reduce electrical losses and improve the overall reliability of the avionics system.

Figure 1:
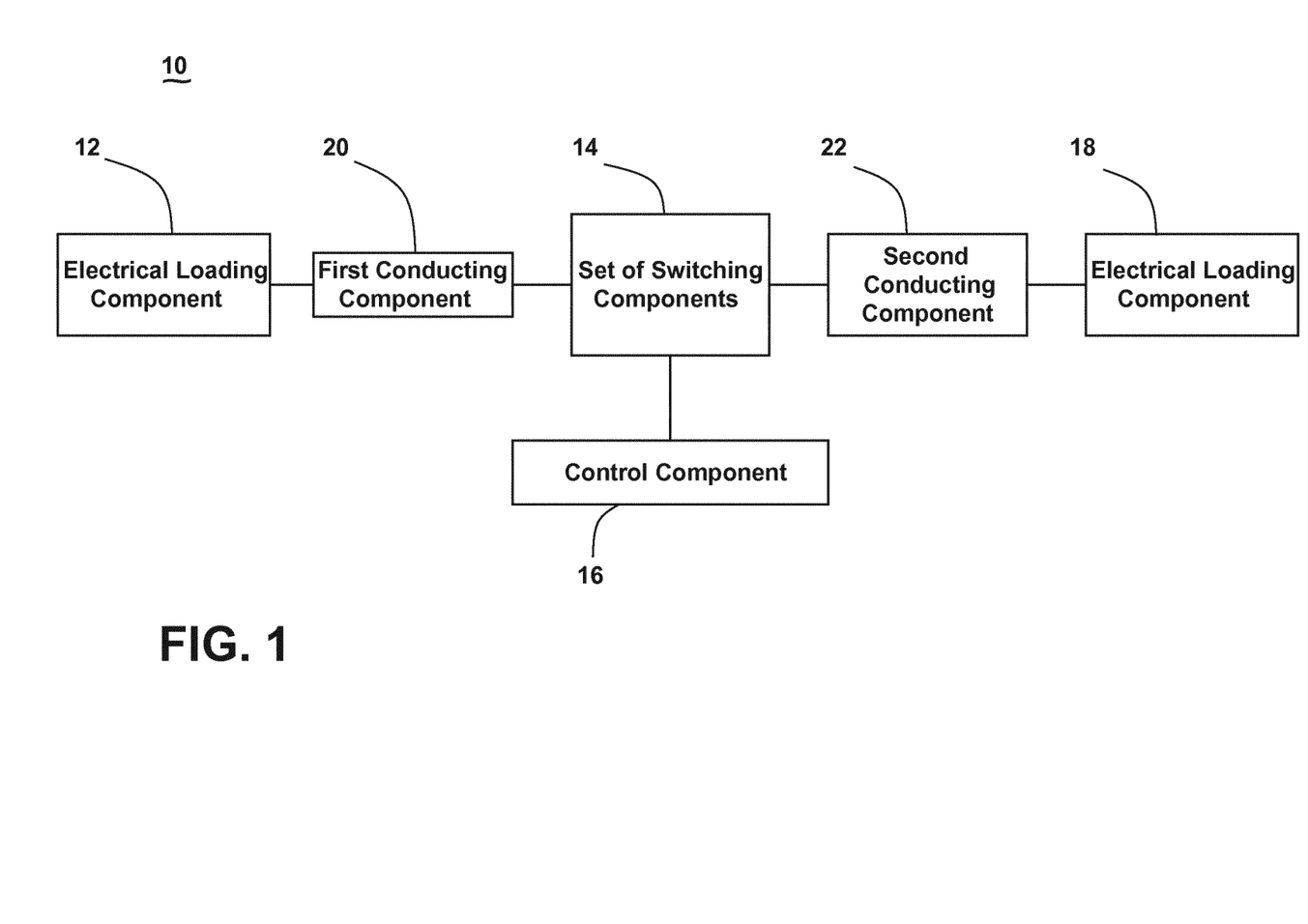
FIG. 1 is an example diagram of a direct current electrical power distribution system in accordance with various aspects described herein.

Turning now to FIG. 1, an example diagram of a direct current electrical power distribution system 10 in accordance with various aspects described herein is shown. The direct current electrical power distribution system 10 includes a direct current source component 12 coupled to a set of switching components 14 through a first conducting component 20. The set of switching components 14 selectively couples power from the direct current source component 12 to an electrical loading component 18 through a second conducting component 22. A control component 16 is coupled to the set of switching components 14 to control and monitor the state of the set of switching components 14.

The direct current source component 12 is a direct current power source or supply. The direct source component 12 can output any positive and negative voltage level for use in distributing electrical power to an electrical loading component 18 including but not limited to 14 VDC, 28 VDC, and positive and negative 270 V.

The set of switching components 14 includes a set of solid-state switches. The set of solid-state switches can include any type of solid-state switch capable of switching on or off (i.e. closed or open) when an external voltage is applied across a set of control terminals of the switch. Each of the solid-state switches in the set of switching components 14 can include a solid-state electronic switching device which switches power to the load circuitry of the electrical loading component 18, and a coupling mechanism to enable the control signal to activate the switch without electromechanical components. The set of switching components 14 can be any type of solid-state electronic switches including but not limited to a solid-state power controller (SSPC), a solid-state relay including a single metal-oxide-semiconductor field-effect transistor (MOSFET), a solid-state relay including multiple MOSFETs arranged in a parallel configuration, etc.

The control component 16 to control and monitor the state of the set of switching components 14 can communicate with other control elements, for example, on an aircraft. In one configuration, the control component 16 includes the provision of SSPCs integrated with the set of switching components 14. SSPCs can perform supervisory and diagnostic functions in order to identify overload conditions and prevent short circuits. Functionally, SSPCs are similar to circuit breakers with electromechanical switching elements that will protect wiring and loads from faults, but because SSPCs are more reliable and faster at switching the power off than electromechanical circuit breaking elements, SSPCs are typically used in safety-critical power systems such as those found in aircraft. SSPCs can switch states within the order of microseconds in comparison to electromechanical switches that require approximately 30 ms to complete a transition from one state to another. The control component 16, implemented with SSPCs, enables the set of switching components 14 to support built-in monitoring and protection features including but not limited to voltage monitoring, current monitoring, temperature monitoring, current limiting, $I^2t$ monitoring, arc fault protection, and low-fidelity ground fault protection, etc. The built-in monitoring and protection features of SSPCs enable the set of switching components 14 to function as a controller that can control outputs to loads to ensure proper operations. SSPCs can include configurable microprocessors that can be programmed to increase controlling characteristics.

Additionally, the control component 16 can report the status of an SSPC back to other vehicle management control systems. The control component 16 can transmit data to the set of switching components 14; the data indicative of commands to the set of switching component 14, reading the status of the set of switching components 14 that includes whether the any of the set of switching components 14 is open or closed and monitoring the health of the set of switching components 14 that includes the temperature of the set of switching components 14. The control component 16 can include any data communications hardware and protocol capable of transmitting data related to the control and the state of the set of switching components 14 including but not limited to a balanced interconnecting cable configured to implement Recognized Standard 485 (RS-485), a two wire serial cable configured to implement controller area network (CAN bus) protocol, a three or five wire serial cable configured to implement Recognized Standard 232 (RS-232), etc.

Figure 2:
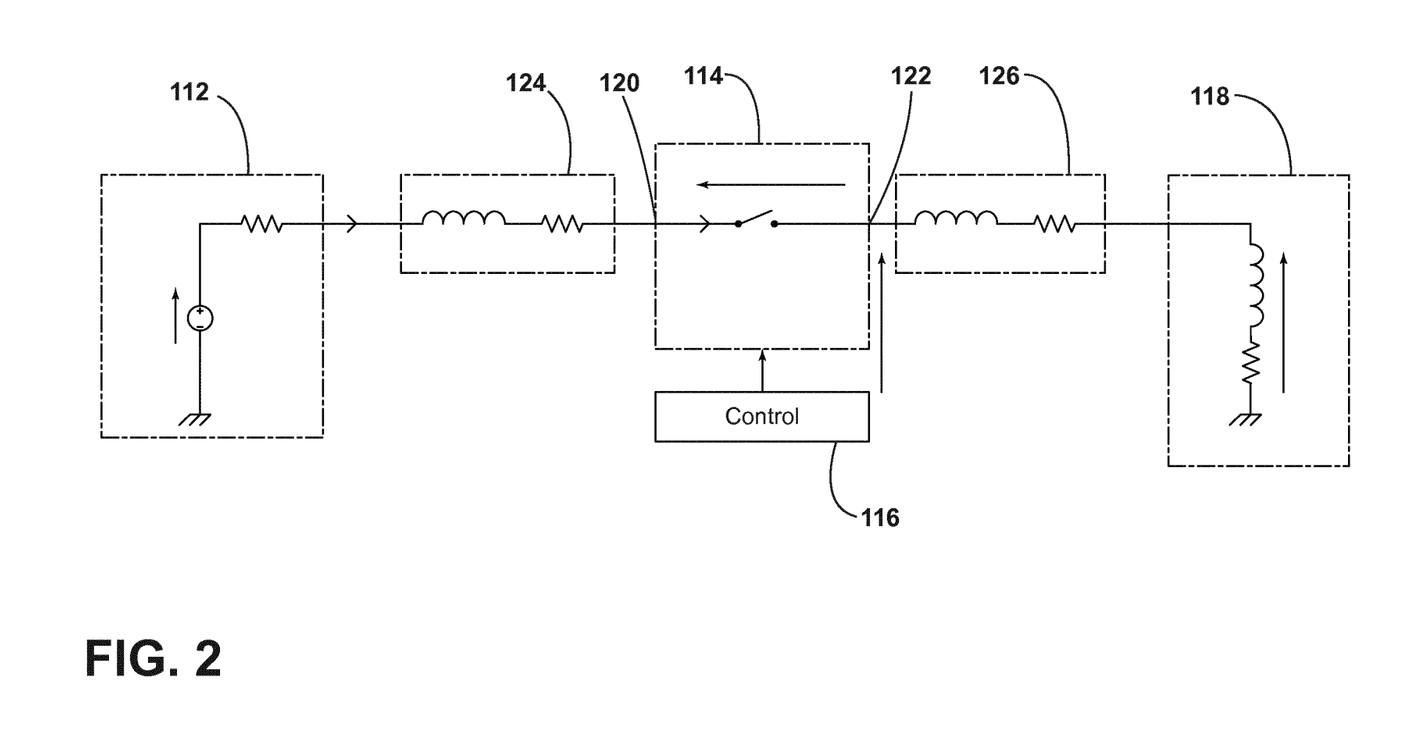
FIG. 2 is an example schematic illustration of a direct current electrical power distribution system in accordance with various aspects described herein.

Referring now to FIG. 2, an example schematic illustration of a direct current electrical power distribution system 100 in accordance with various aspects described herein is shown. The direct current electrical power distribution system 100 is similar to that illustrated in FIG. 1; therefore, like parts will be identified with like numerals increased by 100, with it being understood that the description of the like parts of the first direct current electrical power distribution system applies to the second direct current electrical power distribution system, unless otherwise noted.

The direct current source component 112 is coupled to the set of switching components 114. The coupling between the direct current source component 114 and the set of switching components 114 can include current limiting wire 124 and a first conducting component 120. The set of switching components 114 are coupled to the electrical loading component 118. The coupling between the set of switching components 114 and the electrical loading component 118 can include a second conducting component 122 and current limiting wire 126.

The set of switching components 114 and the control component 116 can include a number of subcomponents and modules for controlling and protecting the set of switching components 114. For example, an SSPC can include a main solid state switch that opens or closes to couple or decouple the electrical loading component 118 to the direct current source component 112. The main solid state switch can include one or more protective elements including but not limited to a metal-oxide varistor (MOV), a transient voltage suppressor (TVS), etc. Other subcomponents can include one or more snubber circuits across the input of the switch, the output of the switch or both, to suppress voltage spikes and dampen ringing caused by circuit inductance when a switch opens. An SSPC can include one or more built-in test circuits to provide Built-In Testing (BIT) features that enable self-testing of the SSPC.

Figure 3:
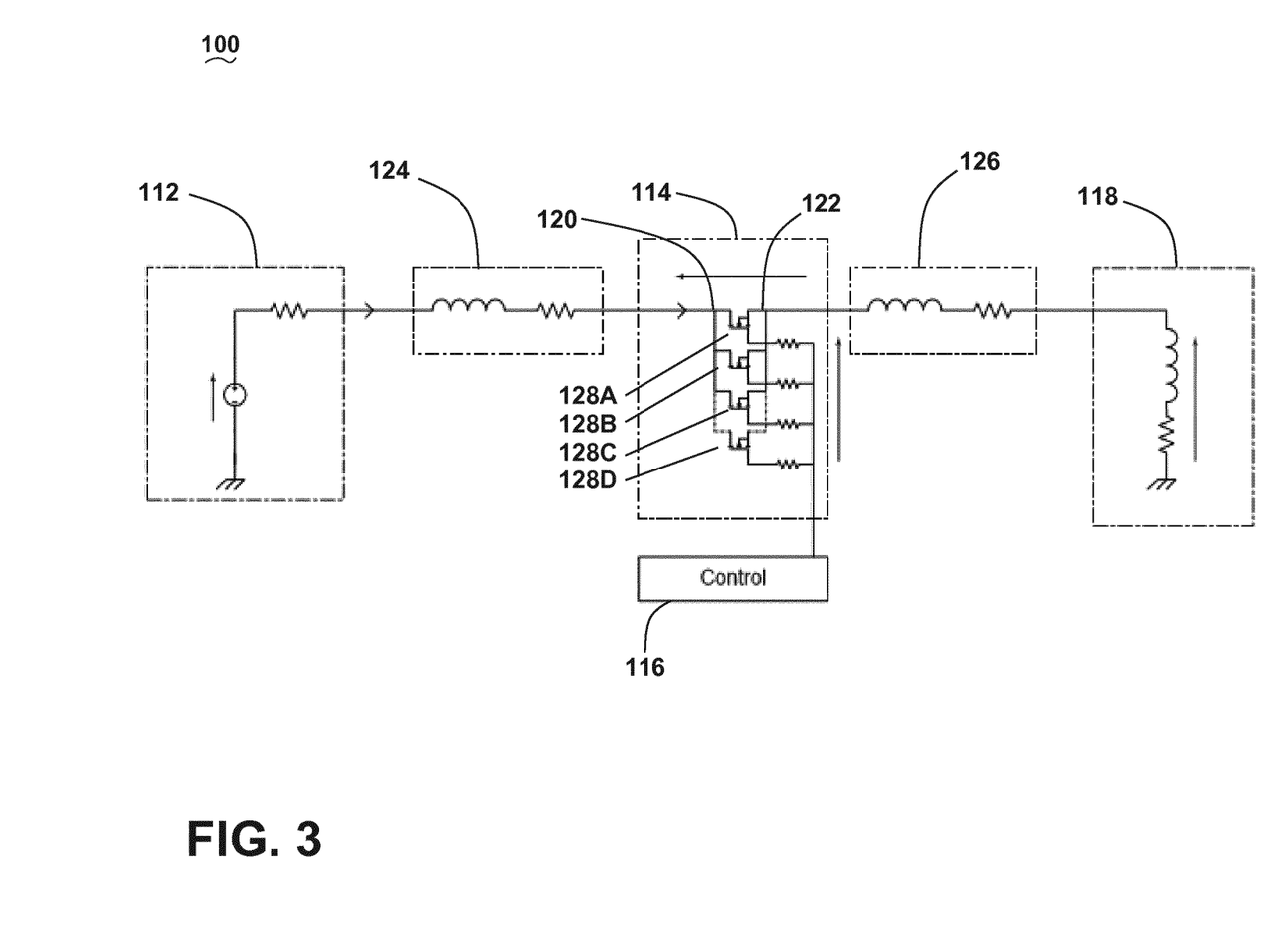
FIG. 3 is an example schematic illustration of a direct current electrical power distribution system that includes a set of solid-state switching elements in accordance with various aspects described herein.

Referring now to FIG. 3, an example schematic illustration of the direct current electrical power distribution system 100 from FIG. 2 is shown with an additional level of detail regarding the set of switching components in accordance with various aspects described herein is shown. The set of switching components 114 include a set of metal-oxide semiconductor field effect transistors 128A, B, C, and D that are electrically coupled in parallel. The first conducting component 120 couples electrical power, in particular, by the flow of current, to each of the metal-oxide semiconductor field effect transistors from the direct current source component 112. Similarly, the second conducting component 122 couples electrical power, in particular, by the flow of current, from each of the metal-oxide semiconductor field effect transistors 128A, B, C, and D to the electrical loading component 118.

In a conventional power switch, the first conducting component 120 at the first transistor 128A, experiences a higher current density than at each succeeding transistor 128B, C and D. That is, power losses in the system are initially large as a result of uniformly distributed tracking resistance. Conversely, along the second conducting component 122 in a conventional power switch, as the current density builds from the transistor 128D to 128A, the extra tracking will induce losses. Therefore, in the power distribution system 10, 100, the width of the first conducting component 120 varies such that the current density in the first conducting component 120 is substantially constant and the width of the second conducting component 122 varies such that the current density in the second conducting component 122 is substantially constant.

Figure 4:
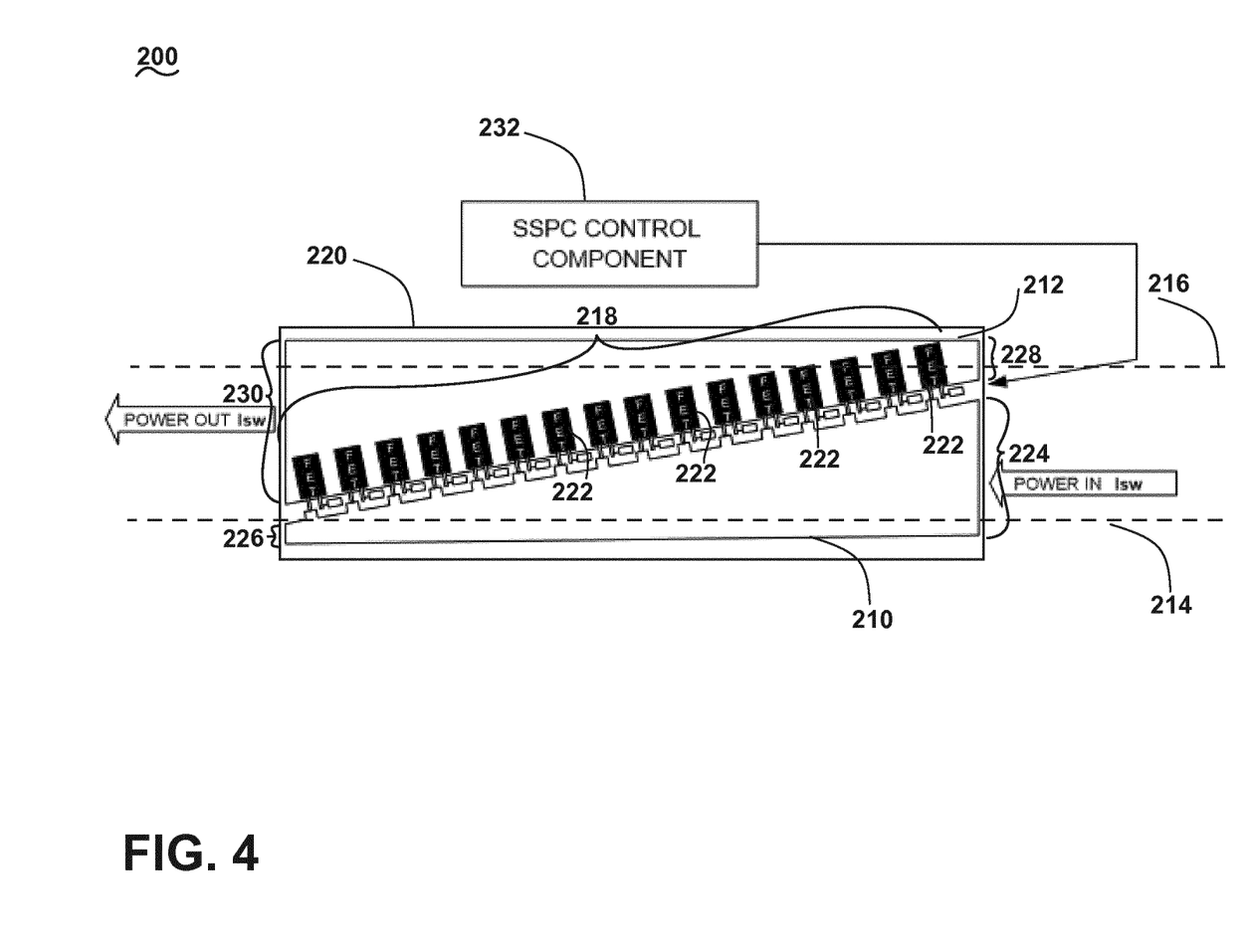
FIG. 4 is an example schematic illustration of a solid-state switch with a set of solid-state switching elements in accordance with various aspects described herein.

Turning now to FIG. 4, an example schematic illustration of a solid-state switch with a set of solid-state switching elements in accordance with various aspects described herein is shown. The apparatus 200 includes printed circuit board 220 on which is formed two conductors 210, 212. Between the two conductors 210, 212, a set of switching components 218 are configured to selectively couple the two conductors electrically based on the control component 232.

The first conductor 210 has a first longitudinal axis 214 along which current flows from the direct current source. Similarly the second conductor 212 has a second longitudinal axis 216 through which current can flow out of the set of switching components 218 to the electrical loading component. The relative alignment of the first longitudinal axis 214 with respect to the second longitudinal axis 216 can be any orientation useful for the implementation and operation of a current switching device, including, but not limited to, a parallel configuration.

The first and second conductors 210 and 212 can be formed of any material useful for transferring electrical current including, but not limited to, copper. Additionally, the first and second conductors 210 and 212 can be formed by any process useful creating conductive tracks including but not limited to processes for manufacturing printed circuit boards.

The width 224, 226 of the first conductor 210 along the first longitudinal axis 214 varies from an initially larger width 224 down to a smaller width 226. In this way, the current density in the first conductor 210 can be made substantially constant along the first longitudinal axis 214. Similarly, the width 228, 230 of the second conductor 212 along the second longitudinal axis 216 varies from an initially smaller width 228 up to a larger width 230 such that the current density in the second conductor 212 is substantially constant along the second longitudinal axis 216. That is, width of the second conductor 212 is tapered along the second longitudinal axis 216 such that the width of second conductor 212 increases as the width of the first conductor 210 decreases. As shown, the widths of the first and second conductors 210, 212 are tapered along their respective longitudinal axes 214, 216 forming a trapezoidal shape with the widest portion of the taper aligning where the current is heaviest. The taper can be any shape useful for equalizing current density in the conductors including, but not limited to, logarithmic, asymmetric etc.

Figure 5:
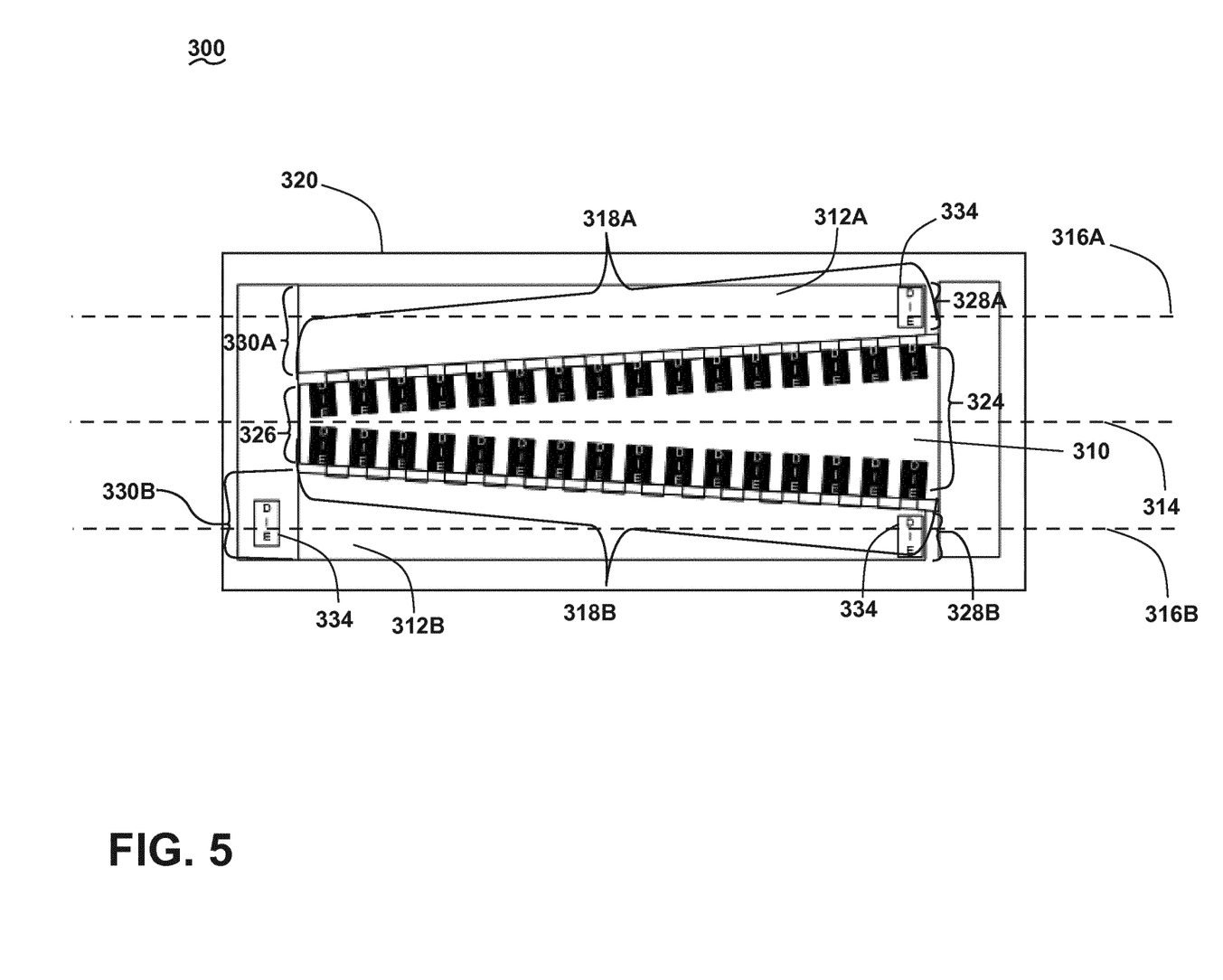
FIG. 5 is an example schematic illustration of a solid-state switch with two subsets of solid-state switching elements in accordance with various aspects described herein.

Referring now to FIG. 5, an example schematic illustration of a solid-state switch with two subsets of solid-state switching elements in accordance with various aspects described herein. The current switching apparatus 300 is similar to that illustrated in FIG. 4; therefore, like parts will be identified with like numerals increased by 100, with it being understood that the description of the like parts of the first current switching apparatus applies to the second current switching apparatus, unless otherwise noted.

The second conductor 312A and B is bifurcated with a first portion 312A along the second longitudinal axis 316A and a second portion 312B along a third longitudinal axis 316B. The set of switching components 318A and B includes a first subset 318A of the switching components coupled to the first portion 312A of the second conductor and a second subset 318B of the switching components coupled to the second portion 312B of the second conductor. The current switching apparatus can include any number of subsets of switching components coupled to a comparable number of portions of the second conductor including but not limited to one, two or more.

The second conductor can include transient suppressors 334 for limiting the effects of large voltage spikes induced on connected wires. The first and second conductors can include any additional elements such as protective elements useful for protecting the current switching apparatus including but not limited to a metal-oxide varistor (MOV), a transient voltage suppressor (TVS), etc.

Figure 6:
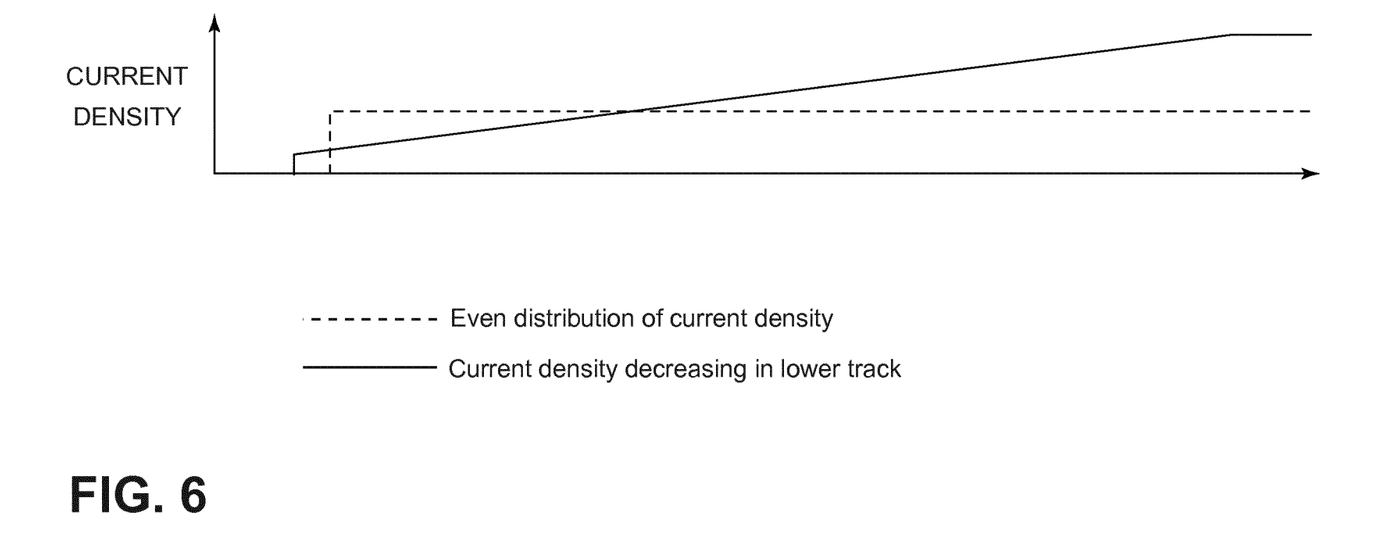
FIG. 6 is an example plot of electric current density in a solid-state switch with a set of solid-state switching elements that demonstrates the distribution of current density in a solid-state switch in accordance with various aspects described herein.

Turning now to FIG. 6, an example plot of electric current density in a solid-state switch with a set of solid-state switching elements that demonstrates the distribution of current density in a solid-state switch in accordance with various aspects described herein is shown. In a conventional current switching apparatus where the conductor is of uniform width, the current density on the output conductor increases as shown on the solid line. Using a tapered conductor as described above, the current density as shown with the dotted line is uniform across the conductor.

Beneficial effects of the above-described embodiments include lowering thermal losses and improving the reliability of electrical distribution systems and the downstream systems powered by the electrical distribution system, particularly in systems that draw high current.

To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An apparatus for electrically switching current, comprising:
   a first conductor formed of an electrically conductive material and having a first longitudinal axis;
   a second conductor formed of the electrically conductive material and having a second longitudinal axis;
   a set of switching components, each component selectively configured to electrically couple the first conductor to the second conductor; and
   a printed circuit board on which the first and second conductors are disposed;
   wherein a predetermined width of the first conductor along the first longitudinal axis varies such that the current density in the first conductor is substantially constant along the first longitudinal axis and a predetermined width of the second conductor along the second longitudinal axis varies such that the current density in the second conductor is substantially constant along the second longitudinal axis.

2. The apparatus of claim 1, wherein each component of the set of switching components is a metal-oxide-semiconductor field effect transistor (MOSFET).

3. The apparatus of claim 2, wherein each of the metal-oxide semiconductor field effect transistors are electrically coupled in parallel.

4. The apparatus of claim 1, wherein the predetermined width of the first conductor is tapered along the first longitudinal axis.

5. The apparatus of claim 4, wherein the predetermined width of the second conductor is tapered along the second longitudinal axis such that the width of second conductor increases as the width of the first conductor decreases.

6. The apparatus of claim 1, wherein the second conductor is bifurcated with a first portion along the second longitudinal axis and a second portion along a third longitudinal axis.

7. The apparatus of claim 6, wherein the set of switching components includes a first subset of the switching components coupled to the first portion of the second conductor and a second subset of the switching components coupled to the second portion of the second conductor.

8. The apparatus of claim 1, wherein the first and second conductors are tracks on the printed circuit board.

9. The apparatus of claim 1, wherein the first and second conductors further include transient suppressor components.

10. The apparatus of claim 1, wherein the first conductor and the second conductor are configured to carry electric current greater than 40 Amperes.

11. A system for electrical power distribution, comprising:
   a direct current source component;
   an electrical loading component capable of drawing electrical power from the direct source component;
   a set of switching components configured to selectively couple power from the direct current source component to the electrical loading component by switching between an open state that decouples power from the direct current source component to the electrical loading component and a closed state that couples power from the direct current source component to the electrical loading component;
   a control component configured to alter the state of the set of the switching components;
   a first conducting component configured flow electrical current between the direct source component and the set of switching components; and
   a second conducting component configured to flow electrical current between the set of switching components and the electrical loading component;
   wherein a predetermined width of the first conducting component varies such that the current density in the first conducting component is substantially constant and a predetermined width of the second conducting component varies such that the current density in the second conducting component is substantially constant.

12. The system of claim 11, wherein each component of the set of switching components is a metal-oxide-semiconductor field effect transistor (MOSFET).

13. The system of claim 12, wherein each of the metal-oxide semiconductor field effect transistors are electrically coupled in parallel.

14. The system of claim 11, wherein the predetermined width of the first conducting component is tapered along the first longitudinal axis.

15. The system of claim 14, wherein the predetermined width of the second conducting component is tapered along the second longitudinal axis such that the width of second conducting component increases as the width of the first conducting component decreases.

16. The system of any of claim 11, wherein the second conducting component is bifurcated with a first portion along the second longitudinal axis and a second portion along a third longitudinal axis.

17. The system of claim 16, wherein the set of switching components includes a first subset of the switching components coupled to the first portion of the second conducting component and a second subset of the switching components coupled to the second portion of the second conducting component.

18. The system of any of claim 11, wherein the first and second conducting components are tracks on a printed circuit board.

19. The system of any of claim 11, wherein the first and second conducting components further include transient suppressor components.

20. The system of any of claim 11, wherein the first conducting component and the second conducting component are configured to carry electric current greater than 40 Amperes.

* * * * *